(12) United States Patent  
Le et al.

(10) Patent No.: US 6,271,707 B1
(45) Date of Patent: Aug. 7, 2001

(54) LEVEL SHIFTER

(75) Inventors: Quang C. Le, Gilbert; Charles H. Matsumoto, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,005

(22) Filed: Feb. 29, 2000

(51) Int. Cl.[7] ........................................................ H03L 5/00
(52) U.S. Cl. ......................................... 327/333; 327/433
(58) Field of Search ........................ 326/80, 81; 327/108, 327/112, 318, 319, 333, 432, 433

(56) References Cited

U.S. PATENT DOCUMENTS

| | | | |
|---|---|---|---|
| 4,220,873 | * 9/1980 | Giordano | 307/254 |
| 4,220,877 | * 9/1980 | Giordano | 307/310 |
| 5,504,450 | * 4/1996 | McPartland | 327/437 |
| 5,852,383 | * 12/1998 | Rombach | 327/538 |
| 6,137,339 | * 10/2000 | Kibar et al. | 327/333 |

* cited by examiner

Primary Examiner—Jeffrey Zweizig
(74) Attorney, Agent, or Firm—Frank M. Scutch, III

(57) ABSTRACT

A level shifter for use in an integrated circuit that translates a binary input signal having a low voltage level to a binary output signal having a different voltage level. The level shifter (10) includes an input stage (20) that receives the input signal and provides control signals to a low state voltage translation circuit (30) and a high state voltage translation circuit (40). The low state voltage translation circuit (30) controls the level shifter (10) when the input signal is low and provides a bias signal to a bipolar device (Q2) adapted to pull the external output signal low. The high state voltage translation circuit (40) controls the level shifter (10) when the input signal is high and includes a voltage reducing circuit (44) operating as a current mirror with a pull-up PMOS transistor (P13) to couple an internal high voltage power supply to the output node (Vout).

25 Claims, 5 Drawing Sheets

LEVEL SHIFTER

FIELD OF THE INVENTION

This invention relates to electronics, in general, and to level shifters, in particular.

BACKGROUND OF THE INVENTION

Transistors used in integrated circuits typically operate between a supply voltage and ground potential. One common supply voltage used in the past has been 5 volts. More recently, circuit devices operating with lower voltage requirements, for example, 3.3 volts, 2.75 volts, and 2.5 volts, have been developed. Future circuits may use even lower voltage supplies. The need for lower voltage supplies results from a number of factors. A lower voltage typically means that less power is consumed by the circuit, which is especially important in battery-operated devices such as cellular telephones. Secondly, submicron Complimentary Metal Oxide Semiconductor (CMOS) or Bipolar CMOS (BiCMOS) processes with increasingly smaller physical dimensions need to operate at lower supply voltages because of reliability concerns, including the hot electron effect and circuit current leakage. Unfortunately, in many instances, higher supply voltages are still required at the interface levels. Thus, level shifters are needed to translate from one voltage level to a higher, or lower, voltage level. Many of these lower voltage integrated circuits have and will continue to interface with conventional higher voltage integrated circuits and with circuits of different voltage levels.

Buffer circuits or level shifters for converting a signal having an input voltage level into a signal having a different predetermined voltage level are commonly used as input buffers in semiconductor devices and have been designed to interface between circuitry of two different voltage levels. Difficulties can arise, however, when designing such buffer circuits that include submicron N-channel Metal Oxide Semiconductors (NMOS) field effect transistors (FETs). For example, in many instances the maximum voltage permitted across any pair of terminals of submicron NMOS transistors is about 3.5 volts. As is known in the art, keeping the voltage across a pair of submicron NMOS terminals below about 3.5 volts in a 0.4 μm CMOS/BiCMOS process for example, generally prevents the occurrence of the hot electron effect, which can degrade the NMOS transistors over time and eventually cause circuit failure.

Accordingly, a need exists for level shifter capable of translating a lower binary voltage signal level to a higher binary voltage signal level. It is desired that the level shifter be configured using CMOS and NPN bipolar devices and that all NMOS transistors included in the level shifter circuitry have voltages at or below a voltage of about 3.5 volts to prevent the potential occurrence of hot electron effects. It is also desired that the quiescent current flowing through the level shifter, for example, during a battery save mode, be relatively low, preferably less than 1 microAmpere (uA) and, most preferably on the order of about a few hundred nanoAmperes (nA).

BRIEF DESCRIPTION OF THE DRAWINGS

The present invention will be better understood from a reading of the following detailed description, taken in conjunction with the accompanying drawing figures in which.

Figure 1:
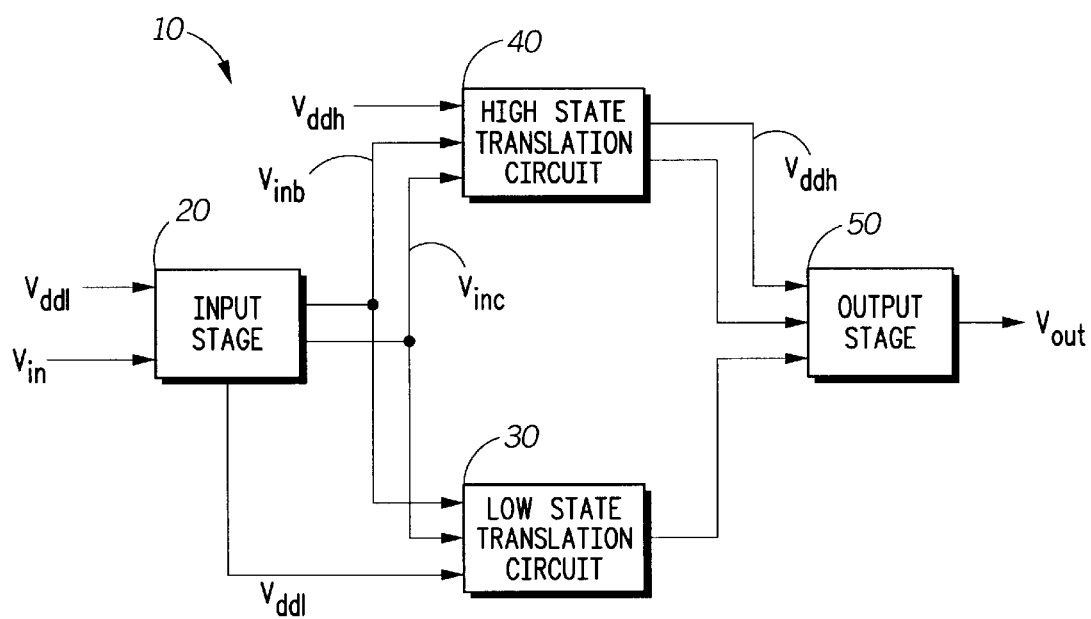
FIG. 1 illustrates a block level diagram for a level shifter in accordance with an embodiment of the present invention.

For simplicity and clarity of illustration, the same reference numerals in different figures denote the same elements, and descriptions and details of well-known features and techniques are omitted to avoid unnecessarily obscuring the present invention. It is understood that the embodiments of the invention described herein are capable of operation in other configurations than described or illustrated herein. It is further understood that the terms so used are for the purposes of describing relative positions and are interchangeable under appropriate circumstances.

DETAILED DESCRIPTION OF THE DRAWINGS

A level shifter capable of translating an external input signal having a low voltage high state to an external output signal having a high state with a different, or higher, voltage is provided. For example, the specific embodiments described herein are capable of translating a binary external input signal of one voltage level to a binary external output signal of another voltage level. The level shifter of the present invention includes a number of CMOS and bipolar devices uniquely arranged to be immune from the problems of hot electron effects. While one embodiment described herein translates a high state voltage of 2.75 volts to a high state voltage of 5.0 volts, those skilled in the art will readily appreciate that translations from and to other voltages may be accomplished by the proper selection of component values and supply voltages. All of the components included within the level shifter may packaged together into a BiCMOS integrated circuit.

A block level diagram of the level shifter 10 is shown in FIG. 1. Level shifter 10 can be used as an input buffer for use in an integrated circuit to translate the high state voltage from a particular voltage level to a high state voltage having a different voltage. In addition, the level shifter 10 can invert the input signal. For example, if the input signal ranges from 0 to 2.75 volts, the output signal can correspondingly range from 5.0 to 0 volts. The level shifter 10 receives an external input signal at its input terminal Vin, as well as an internal low power supply voltage Vddl, and generates an external output signal on its output terminal Vout. The level shifter 10 includes an input stage 20 designed to receive the external input signal at the input terminal Vin and the internal low power supply voltage Vddl, and generate one or two internal control signals Vinb, which is the inversion of the external input signal, and, if required, Vinc, which is the inversion of Vinb and, therefore, mirrors the external input signal. The low state translation circuit 30 is also powered by the low supply voltage source Vddl. The internal low power supply voltage Vddl is preferably equal to the external input voltage signal in its high state.

The low state translation circuit 30 is controlled by the one or two internal control signals, Vinb and Vinc, and operates to control the output stage 50 when the external input signal is low. In one embodiment, the low state translation circuit 30 pulls the signal at the output terminal Vout to its low state when the input signal is low. Alternatively, the low state translation circuit 30 can allow the signal at the output terminal Vout to transition to its high voltage state when the input signal at Vin is low. Similarly, the high state translation circuit 40 is also controlled by the one or two internal control signals, Vinb and Vinc, and acts to control the output stage 50 when the external input control signal is high. A portion of the high stage translation circuit 40 is also powered with an internal high power supply voltage Vddh as an input, which is preferably set at or approximately near the desired high state voltage output of the level shifter 10. In one embodiment, when the input signal at the input terminal Vin is high, the high state translation circuit 40 is adapted to pull the output signal at the output terminal Vout high, or equivalent to the internal high power supply voltage Vddh. Alternatively, when the input signal at the input terminal Vin is high, the high state translation circuit 40 allows the output signal at Vout to transition to its low state, or to ground potential.

Figure 2:
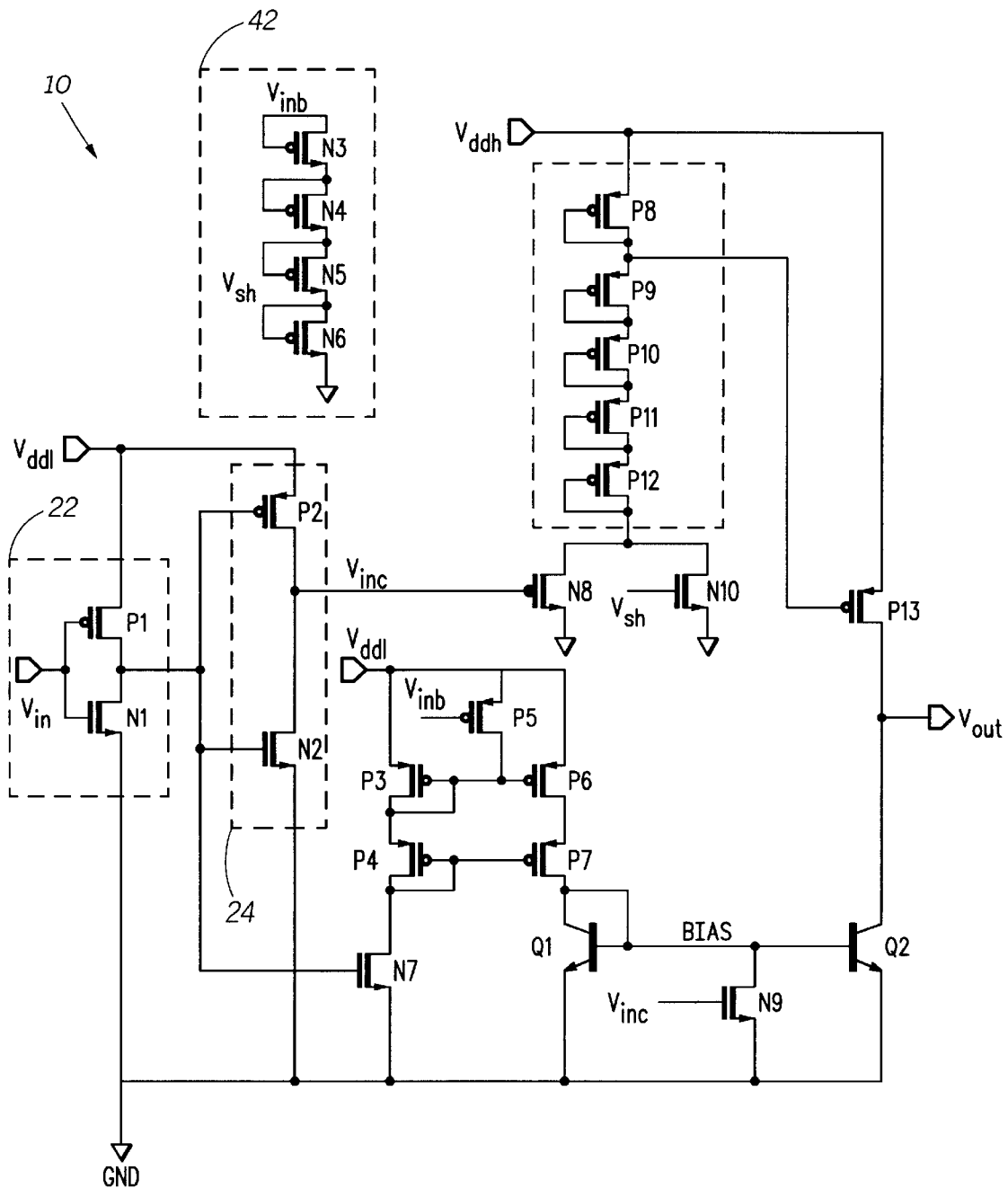
FIG. 2 illustrates a schematic diagram of the circuit structure for a level shifter in accordance with an embodiment of the present invention.

One embodiment of the circuitry included in level shifter 10 is shown in FIG. 2. Level shifter 10 includes input terminal Vin, which receives an external binary input signal generally having a lower voltage level, for example between 0 and 2.75 volts. The input stage 20 consists of P-channel Metal Oxide Semiconductor (PMOS) P1 and NMOS N1, which form a first inversion circuit 22. The junction of P1 and N1 forms an output node as an internal control signal Vinb, which is the inversion of Vin. PMOS P1 and NMOS N1 are connected in series, the drain of P1 connected to the drain of N1. This first inversion circuit 22 is powered by an internal low power supply voltage Vddl, which preferably generates a voltage approximately equivalent to the high state voltage of the external input signal Vin, for example, 2.75 volts. This internal low power supply voltage is coupled to the source terminal of P1 and the source terminal of N1 is coupled to a low voltage potential such as ground. Thus, when the voltage of the external input signal at Vin is 0 volts, the voltage at the output node Vinb is 2.75 volts; likewise when the voltage of the external input signal at Vin is 2.75 volts, the voltage at the output node on control signal Vinb is 0 volts.

The internal control signal Vinb is coupled to a second inversion circuit 24 formed by PMOS P2 and NMOS N2. P2 and N2 are connected in series, the drain of P2 connected to the drain of N2. The internal low power supply voltage Vddl is coupled to the source terminal of P2 and the source terminal of N2 is coupled to the low voltage potential. P2 and N2 form a second inversion circuit 24 in which the junction of P2 and N2 forms an output node having an internal control signal Vinc, which is the inversion of Vinb and mirrors Vin. The first and second inversion circuits 22 and 24 are powered by having the source terminals of P1 and P2 connected to the internal low power supply voltage Vddl. As an example, if the level shifter 10 is designed to receive input voltages between 0 and 2.75 volts, and translate such input voltages to an output voltage between 0 and 5 volts, Vddl may be set to about 2.775 volts. As described in more detail herein, the outputs of the inversion circuits 22 and 24 are used in the level shifter 10 to control various components of the level shifter 10 and the current flowing through such components.

This embodiment of the level shifter 10 also includes a low state voltage translation circuit 30 designed to control the low voltage signal state of the external output signal. This low state voltage translation circuit 30 is formed by the combination of PMOS FETs P5, P3, P4, P6, and P7, NMOS N7 and N9, and bipolar NPN transistor Q1. The low internal power supply voltage Vddl powers this low state voltage translation circuit 30 and is coupled to the source terminals of PMOS transistors P3, P5, and P6. The drain of P3 is connected to the source of PMOS P4. Similarly, the drain of PMOS P6 is connected to the source of PMOS P7. Thus, the combination of P3, P4, P6, and P7, which are PMOS transistor devices having substantially identical geometrical shape, form a current-mirror circuit in which the current flowing through P3 and P4 mirrors the current flowing through P6 and P7. P5, having its drain coupled to the gates of P3 and P6, controls the connection of P3 and P6 to the internal low power supply voltage Vddl. P5 is controlled by the inversion of the external input signal, Vinb, which is connected to the gate of P5. Thus, for example, when the external input signal is high, or 2.75 V, Vinb is low at 0 V. Therefore, the gate voltage of PMOS P5 is at 0 V. Thus, P5 is on, connecting its drain and source together making the source-to-gate voltage of PMOS P3 and P6 at approximately 0 V. As a result, P3 and P6 are shut off, prohibiting current from flowing into P4 and P7.

NMOS N7 also has its gate connected to the inversion of the external input signal, Vinb. N7 directly controls the operation of P4 and P7, with the drain of N7 connected to the gates of P4 and P7. Thus, when the external input signal is low, N7 is turned on and, as a result P4 and P7 are also on. Due to the current mirror formed by P3, P4, P6, and P7, P3 and P6 are also on. As the current-mirror circuit formed by P3, P4, P6, and P7 is coupled between the internal low voltage supply Vddl and the low voltage potential, or ground, the voltage across any two pairs of terminals of such transistors will always be at most equivalent to the internal low power supply voltage Vddl, for example, 2.775 volts, thus preventing the hot electron effect from degrading NMOS N7.

An output current mirror is formed by the combination of Q1 and a second NPN transistor Q2, which forms a part of the output stage 50. The base of Q1 is biased by and coupled to the drain of P7. The collector of Q1 is also connected to its base and coupled to the drain of NMOS N9, and the emitter of Q1 is coupled to the low voltage potential, typically at ground potential. The drain of N9 is also connected to the base of Q2 so that N9, which is controlled by having its gate connected to the mirror of the external input signal, Vinc, can rapidly discharge the excess base currents of Q1 and Q2, to turn them off quickly.

The embodiment of the level shifter 10 shown in FIG. 1 further includes a high state voltage translation circuit 40. In this embodiment, the high state voltage translation circuit 40 includes a voltage reducing circuit 42 formed by an NMOS transistor stack consisting of substantially identical NMOS transistors N3, N4, N5, and N6, coupled together in series with the source of N3, N4, and N5 coupled to the gate and drain terminals of N4, N5, and N6 respectively. The source of N6 is connected to the low voltage potential. This NMOS transistor stack (N3–N6) is controlled and powered by Vinb, the inversion of the external input signal. The voltage reducing circuit produces a reduced voltage Vsh, as an output coupled to the drain of N5. The reduced voltage Vsh will be about one-fourth of the internal low power supply voltage Vddl. For example, if the internal supply voltage is about 2.775 volts, Vinb will also be about 2.775 volts, and voltage Vsh will be about 0.7 volts and will be used as described herein.

The high state translation circuit 40 further includes a voltage divider circuit formed by a PMOS transistor stack comprising P8, P9, P10, P11, and P12 connected in series in which the drain of P8, P9, P10, and P11 is connected respectively to the source of P9, P10, P11, and P12. The gate of each PMOS device P8–P12 is coupled to its drain terminal, thus each PMOS transistor P8–P12 has equal voltage drop across their source to drain terminals. The PMOS transistor stack is powered by a high power supply having a positive potential of Vddh, which typically is the desired high state output voltage of the level shifter 10. Thus, the source of P8 is coupled to Vddh. The current flow rough the PMOS stack P8–P12 is controlled by both NMOS N8 and NMOS N10. N8 is controlled by having its gate coupled to Vinc (which mirrors the external input signal Vin) and its source coupled to ground. N10 is controlled by having its gate coupled to the reduced voltage Vsh and its source coupled to the low voltage potential. There will always be some amount of current flowing through PMOS transistor stack P8–P12, the specific amount determined by whether N8 or N10 is on. If N8 is on, a large current flows through N8 to the PMOS stack P8 to P12. It should be noted that when N8 is on, the voltage to its gate, Vinc, is high. However, Vinb is low (it is the inversion of Vinc) and, therefore, the NMOS stack N3, N4, N5 and N6 is off because the supply power of N3 to N6 is Vinb, which is low in this case. Thus, Vsh is almost at ground, approximately 0 volts. Hence, NMOS N10 is off. On the other hand, when NMOS N8 is off, N10 is on but because N10 is a weak transistor, such that when N10 is controlling the current flowing through the PMOS transistor stack P8–P12, the current is only on the order of a few nanoAmperes. Thus, the voltages across the PMOS transistor stack P8–P12 are low. This small amount of current flowing through the PMOS transistor stack P8–P12 ensures that the voltages at the drain of both N8 and N10 are below the dangerous maximum hot electron voltage level of 3.3 volts. In addition, because the low supply voltage is set to 2.75 volts, the voltage across NMOS transistors N2 and N7 are protected from the hot electron effect because the voltage across N2 and N7 can be at most 2.75 V, which is below the dangerous voltage level of 3.3 V. When the input signal is high, the voltage across each of the transistors forming the PMOS transistor stack P8–P12 is about 0.7 volts. Thus, for the particular example described herein, the maximum voltage flowing across the terminals of N8 is less than 1.0 V. Thus, both NMOS N8 and N10 are not degraded by the hot electron effect.

The output stage 50 includes a pull-up PMOS P13 having its gate coupled to the drain of one of the transistors comprising the PMOS transistor stack P8–P12, for example, P8. The output stage 50 will pull the output signal Vout high when the external input signal is high. The source terminal of P13 is connected to the internal high power supply level voltage Vddh to pull the output Vout to the high level Vddh.

The operation of the level shifter 10 of FIG. 2 will now be described. When the external input signal applied to Vin is low (for example 0 volts), Vinb is high (for example, 2.75 volts), NMOS N7 turns on and PMOS P5 turns off (both being driven by the high inversion signal Vinb). As a result, P3, P4, P6, and P7 turn on and current flows through the current mirror circuit formed by P3, P4, P6, and P7. Current flowing through the drain terminal of P7 turns on NPN transistors Q1 and Q2. The output voltage at the external output terminal Vout is discharged through Q2, thus pulling the output voltage Vout low. Since Vin is low, Vinb is high, PMOS P2 is off and, because Vinc is low, the gate terminal of NMOS N8 is at ground, so that N8 is also off. As indicated above, when N8 is off, N10 is on with a very small current flowing through transistors PMOS P8–P12. As a result, the PMOS transistor stack formed by P8–P12 is almost off (or very weakly on with a few hundred nanoAmperes flowing therethrough) and, thus, the output PMOS P13 is off because NPN transistor Q2 turns on and overcomes PMOS transistor P13. Thus, the output Vout is pulled low by NPN transistor Q2. The inversion signal Vinb is high (for example 2.75 V) and provides power to the NMOS transistor stack N3–N6. Thus, the NMOS transistor stack N3–N6 turns on, generating the voltage Vsh at the drain of NMOS N6 (about one-fourth of Vinb (0.7 V)). The voltage Vsh is applied to the gate of N10, generating a small amount of current in the order of a few hundred nanoAmperes flowing through the PMOS transistor stack P8–P12. This small current keeps the drain terminals of both NMOS transistors N8 and N10 from rising to the high voltage Vddh. Thus, N8 and N10 will not be effected by the hot electron effect, which would degrade them if their drain voltages rise above 3.5 V.

When the external input signal Vin is high (for example, 2.75 volts), Vinb is low and NMOS N7 is off, thus cutting off the current through PMOS P3 and P4. At the same time, with Vinb low, PMOS P5 turns on, shorting the gate and source terminals of both transistors P3 and P6. As a result, the transistors forming the mirror current circuit of P3, P4, P6, and P7 are also off, as well as the NPN transistors Q1 and Q2. Since Vinb is low, and Vinc is high, NMOS N9 is on (controlled by Vinc) and assists in removing excess base charge from the base of NPN transistor Q2 (which goes to saturation when Vin is low). Simultaneously, with Vinb low, PMOS P2 is on and the drain terminal of P2 pulls the gate terminal of N8 to approximately the same voltage as the internal low power supply voltage Vddl, or about 2.75 volts. The NMOS transistor stack N3–N6 is off, turning off N10. The PMOS transistor stack P8–P12 is on (controlled by N8) and a relatively larger amount of current flows through the PMOS transistor stack P8–P12. P13 is turned on and the voltage at the external output terminal Vout is pulled high to the same level as the internal high power voltage supply Vddh, or 5 volts.

In quiescent state, only a small amount of current flows through the PMOS transistor stack P8–P12 to N10 and the NMOS transistor stack N3–N6 if the input Vin is low and a small amount of current flowing through PMOS stack P8–P12 and NMOS N8 if the input Vin is high. This quiescent current is on the order of a couple hundreds of nanoAmperes (nA), up to a maximum of about 1 microAmpere (uA).

Figure 3A:
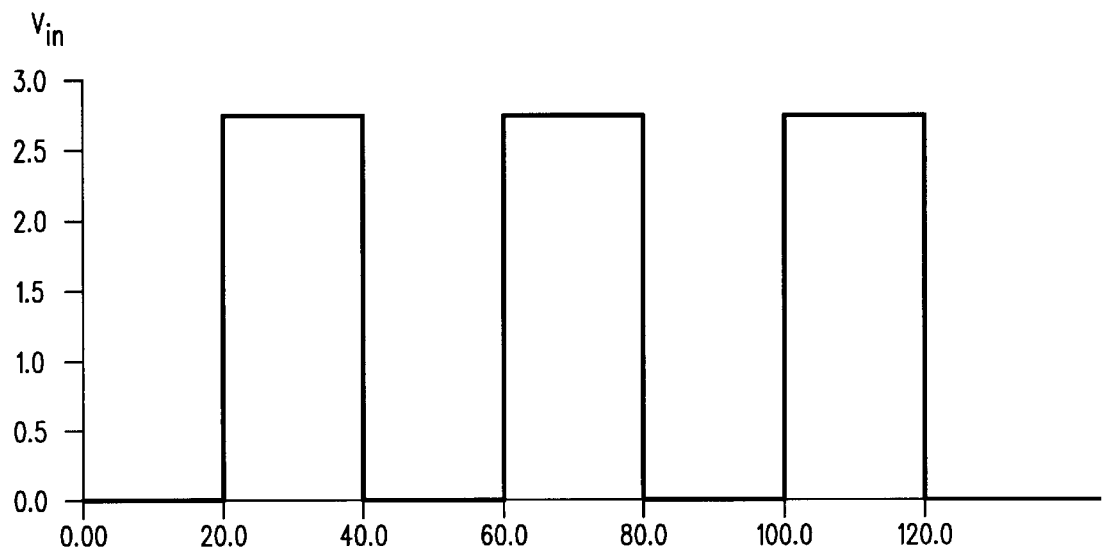
FIGS. 3A and 3B illustrates a timing diagram for the circuit structure of FIG. 2 in accordance with an embodiment of the present invention.
Figure 3B:
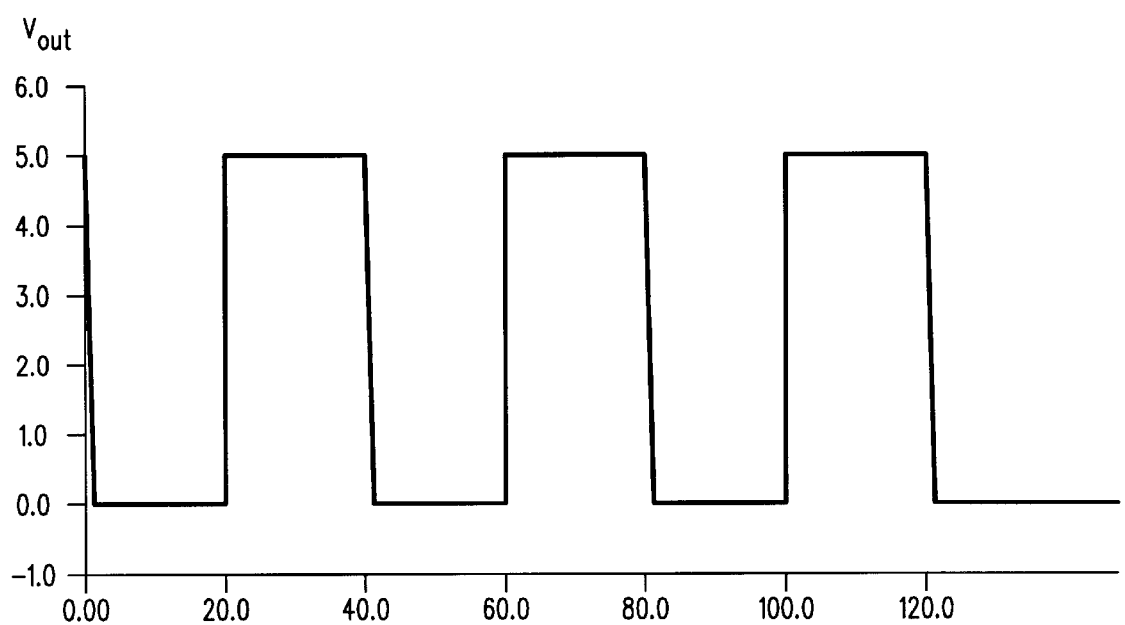

FIGS. 3A and 3B are charts of signal waveforms for the level shifter 10 of FIG. 2. In this example, the input voltage levels range from 0 to 2.75 volts and the corresponding output voltage levels range from 0 to 5 volts.

The following table provides the presently preferred component values and as-drawn dimensions for the electrical components of level shifter 10 of FIG. 2, assuming that the external input signal ranges from 0 to 2.75 volts and the desired external output signal ranges from 0 to 5.0 volts:

| COMPONENT | PREFERRED VALUE |
|---|---|
| Vddl | 2.75 V |
| Vddh | 5.0 V |
| P1 | 20/4 |
| N1 | 10/4 |
| P2 | 20/4 |
| N2 | 10/4 |
| P3 | 8/100 |
| P4 | 8/100 |
| P5 | 10/4 |
| P6 | 8/100 |
| P7 | 8/100 |
| N7 | 20/8 |

-continued

| COMPONENT | PREFERRED VALUE |
|---|---|
| Q1 | 12/6 |
| N9 | 10/4 |
| N3 | 8/20 |
| N4 | 8/20 |
| N5 | 8/20 |
| N6 | 8/20 |
| N8 | 20/10 |
| N10 | 8/100 |
| P8 | 8/50 |
| P9 | 8/50 |
| P10 | 8/50 |
| P11 | 8/50 |
| P12 | 8/50 |
| P13 | 16/10 |
| Q1 | 90/6 |

Due to common manufacturing effects such as etching undercut, the final dimensions are about a factor of approximately 0.15 of those shown in the table.

Figure 4:
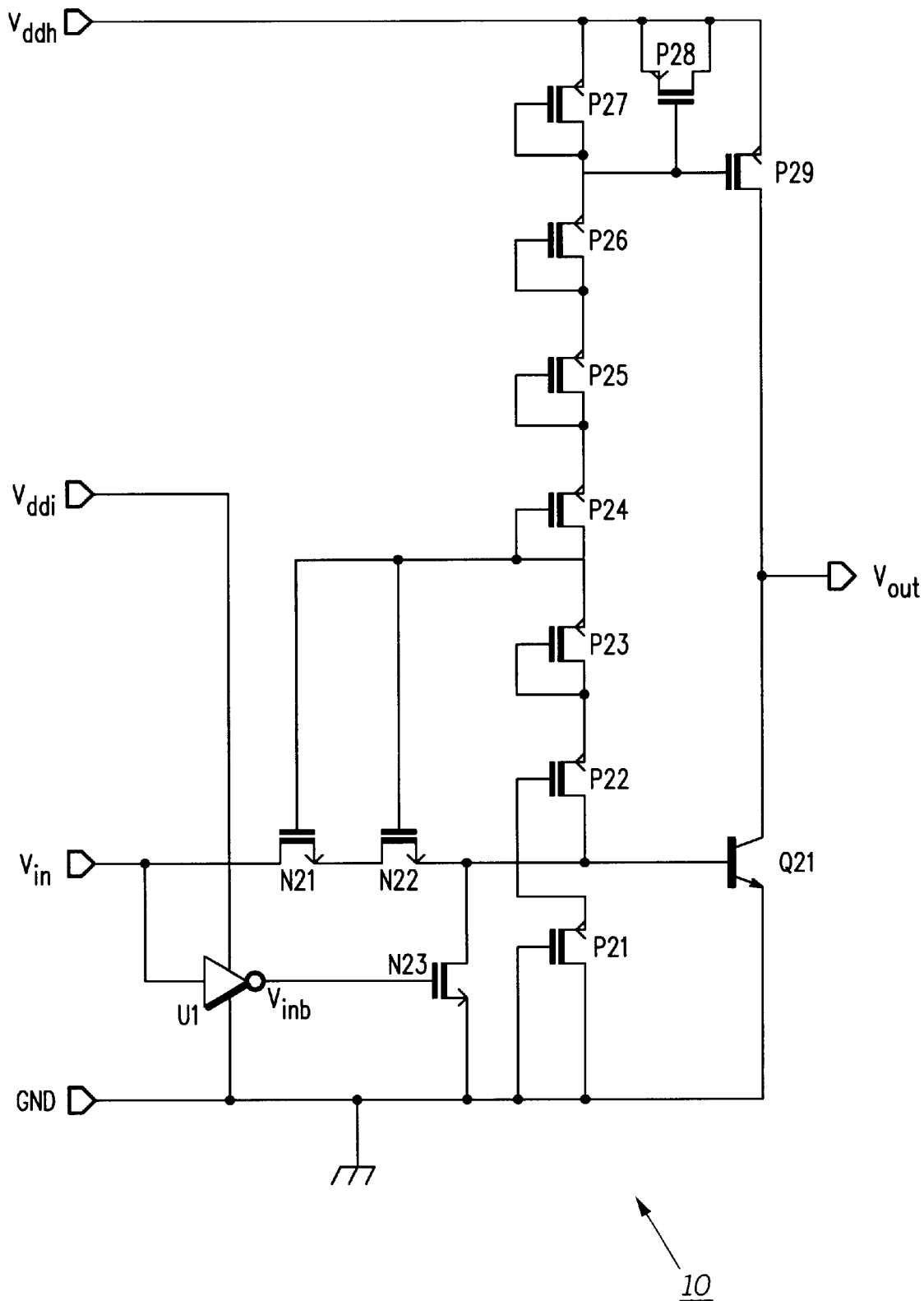
FIG. 4 illustrates a schematic diagram of the circuit structure for a level shifter in accordance with an other embodiment of the present invention.

FIG. 4 illustrates another embodiment of the level shifter 10. Level shifter 10 in FIG. 4 includes an input terminal Vin adapted to receive an external input signal that varies from a low state to a high state, for example, between 0 and 2.75 volts. This embodiment produces an inversion of the input signal, as well as a level shift. The input signal is coupled to an inverter U1, which produces an output control signal Vinb that is the inversion of the input signal. The control signal Vinb is coupled to NMOS transistor N23. The drain terminal of N23 is coupled to the output of a pair of NMOS transistors N21 and N22, and the source terminal of N23 is connected to a low voltage potential, or ground. In this embodiment, the NMOS transistors N21, N22, and N23 form the low state translation circuit. The drain terminal of N21 is coupled to the input signal and the source of N21 is coupled to the drain terminal of N22. The gate terminals of both N21 and N22 are connected to a node within the voltage divider circuit as described herein. The source terminal of N22 is also connected to the base terminal of an NPN device Q21, which forms the low state device of the output stage 50. The drain terminal of N23 is also coupled to the base of Q21 as a bias signal to pull excess charge quickly from Q21 when the external input signal at the input terminal Vin is high.

The level shifter 10 shown in FIG. 4 also includes a voltage divider circuit that includes seven high state PMOS transistors P21, P22, P23, P24, P25, P26, and P27 connected to each other in series with the drain terminals of each PMOS transistor coupled to the source terminal of the adjacent PMOS device. The gate terminals of devices P21–P26 are also coupled to their respective drain terminals. The gate of P21 is coupled to the low voltage potential. The source terminal of the first PMOS device, P27 is coupled to an internal high power supply voltage Vddh, which may be set to the desired high state output voltage, for example, 5.0 volts. Each of the seven PMOS transistors included within the voltage divider circuit dissipates approximately one-seventh of the voltage Vddh. The drain terminal of one of the PMOS devices included within the voltage divider circuit, for example, P24, is coupled to the gate terminals of the two NMOS devices, N21 and N22 in order to bias devices N21 and N22. In addition, another of the drain terminals of one of the PMOS devices within the voltage divider circuit, for example P27, is coupled to as a high state control signal to the gate terminal of the high state pull-up device, PMOS P29, of the output stage 50. The geometries of each of the PMOS devices P21–P27 should preferably match.

The level shifter 10 may also include PMOS P28, having its source and drain terminals coupled together to the internal high power supply voltage Vddh to act as a high frequency noise filter.

In operation, the level shifter 10 of FIG. 4 receives an external input signal at input terminal Vin, for example 0 volts in the low state. Inverter U1 inverts this signal and supplies the internal low power supply voltage Vddl to the gate of N23, turning this NMOS transistor on. As a result, the charge at the base terminal of Q21 discharges through device N23. The internal high power supply voltage Vddh is flowing through the PMOS stack P21–P27, which acts as a high value resistor. P27 and P29 act as a current mirror with a current gain of about 4×flowing through P29. This higher current flowing through P29 provides a faster rise time on the output, and pulls the external output signal Vout high. Once the output at the external output terminal has settled in its high state, the current is reduced to approximately the leakage current of Q21 and the output load (which is high impedance).

When the external input signal Vin is high, or 2.75 volts, transistor N23 is shut off. Transistors N21 and N22 act as a high value resistive device to reduce the current flowing to Q21. As a result, the charge at the base of Q21 dissipates and Q21 pulls the external output signal Vout low, or to 0 volts.

Figure 5A:
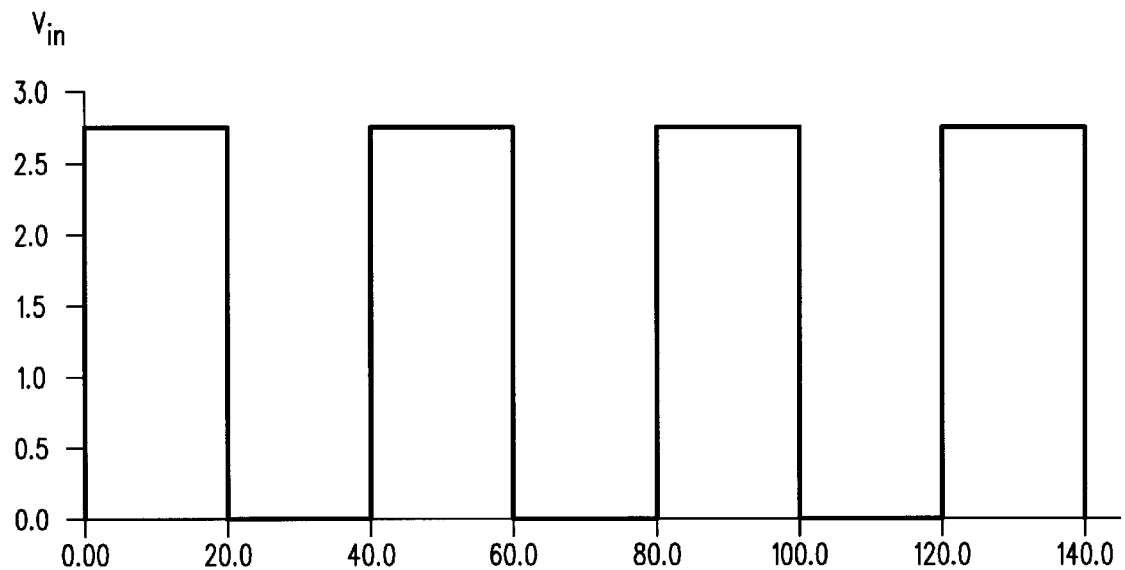
FIGS. 5A and 5B illustrates a timing diagram for the circuit structure of FIG. 4 in accordance with an embodiment of the present invention.
Figure 5B:
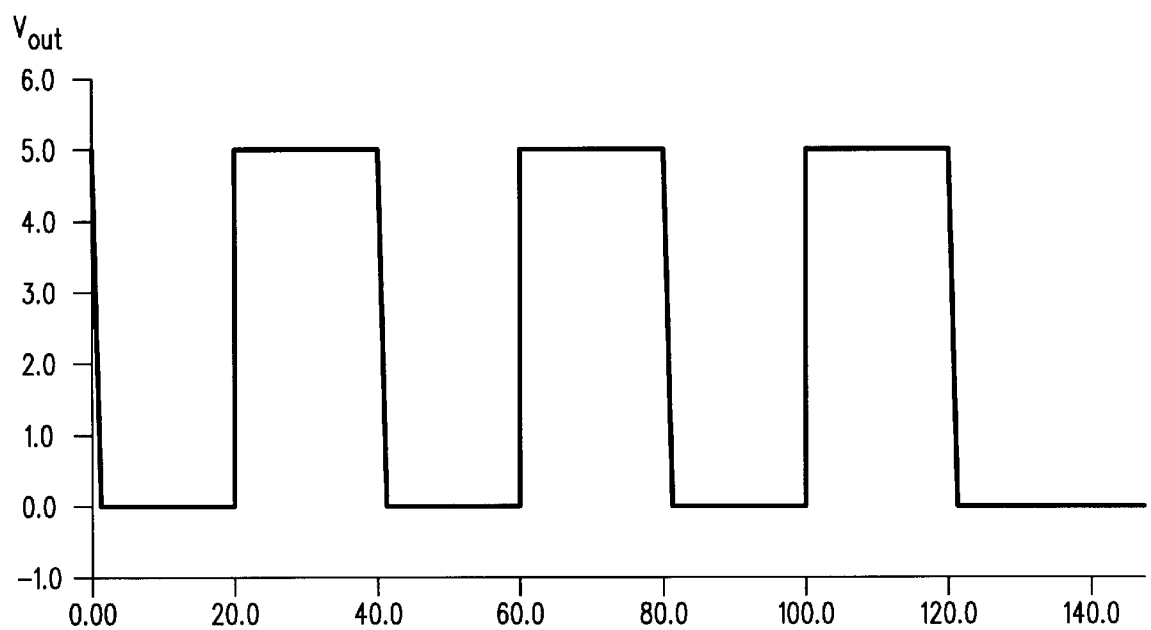

FIGS. 5A and 5B are timing charts of signal waveforms for the level shifter 10 of FIG. 4. In this example, the input voltage levels range from 0 to 2.75 volts and the corresponding output voltage levels range from 5 to 0 volts.

The following table provides the presently preferred component values and as-drawn dimensions for the electrical components of level shifter 10 of FIG. 4, assuming that the external input signal ranges from 0 to 2.75 volts and the desired external output signal ranges from 0 to 5.0 volts:

| COMPONENT | PREFERRED VALUE |
|---|---|
| Vddl | 2.75 V |
| Vddh | 5.0 V |
| U1 | 8/4 |
| N21 | 8/300 |
| N22 | 8/300 |
| N23 | 20/10 |
| P21 | 10/100 |
| P22 | 10/100 |
| P23 | 10/100 |
| P24 | 10/100 |
| P25 | 10/100 |
| P26 | 10/100 |
| P27 | 10/100 |
| P28 | 10/100 |
| P29 | 40/100 |
| Q21 | 72/6 |

Due to common manufacturing effects such as etching undercut, the final dimensions are about a factor of approximately 0.15 of those shown in the table.

Therefore, an improved level shifter capable of translating a binary input signal ranging from a lower voltage to an external output signal having a higher voltage (which may be inverted) that is immunized from the hot electron effects that may arise with submicron NMOS transistors, is achieved. The present invention is not limited by the particular transistor sizes or threshold voltages described herein. The circuits forming the invention can be fabricated using NMOS and PMOS transistors having a single turn-on threshold voltage that are adequately protected from the hot electron effect.

Although the invention has been described with reference to specific embodiments, it will be understood by those skilled in the art that various changes and modifications may be made without departing from the spirit or scope of the invention. For instance, the numerous details set forth herein such as, for example, the particular component and voltage values, are provided to facilitate the understanding of the invention and are not provided to limit the scope of the invention. Furthermore, while certain nominal values for the components included in the embodiments of level shifter 10 have been provided herein, other values may be appropriate for use in connection with other voltages to be translated. Such other values may be readily determined by one skilled in the art. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A level shifter comprising:
   an input terminal for receiving an input signal having low and high voltage states;
   an output terminal for providing an output signal having low and high voltage states, wherein a voltage of the high voltage state of the output signal is different than a voltage of the high voltage state of the input signal;
   an input stage coupled to the input terminal and generating a first internal control signal that represents an inversion of the input signal;
   a low state voltage translation circuit coupled to the input stage for receiving the first internal control signal and generating a bias signal when the input signal is in its low voltage state;
   a high state voltage translation circuit coupled to the input stage and a high power supply voltage to generate a high state control signal at a high state output node, wherein the high power supply voltage is approximately equivalent to the voltage of the high voltage state of the output signal, wherein the high state voltage translation circuit comprises a plurality of high state PMOS transistors coupled to the high power supply voltage and arranged as a voltage reducing circuit; and
   an output stage coupled to the low state voltage translation circuit, the high state voltage translation circuit, and the output terminal and providing the output signal comprising:
      a PMOS pull-up transistor connected to the high power supply voltage and coupled to the high state output node to receive the high state control signal to couple the high power supply voltage to the output terminal to pull the output signal to its high voltage state, wherein a current flowing through the PMOS pull-up transistor approximately mirrors a current flowing through the voltage reducing circuit of the high state voltage translation circuit; and
      a first bipolar device adapted to pull the output signal to its low voltage state.

2. The level shifter of claim 1 wherein the input stage comprises:
   a first inversion circuit coupled to the input terminal and that receives the input signal and generates the first internal control signal that represents the inversion of the input signal; and
   a second inversion circuit coupled to the first inversion circuit and that receives the first internal control signal and generates a second internal control signal that represents an inversion of the first internal control signal;
   wherein:
      both the first and second inversion circuits are powered by a low power supply voltage such that voltages of the first and second internal control signals are approximately equivalent to the voltage of the high voltage state of the input signal.

3. The level shifter of claim 2 wherein:
   the first inversion circuit comprises a first pair of transistors in which a gate of each of the first pair of transistors is connected to the input terminal, a source of a first one of the first pair of transistors is coupled to the low power supply voltage, and a drain of the first one of the first pair of transistors is coupled to a drain of a second one of the first pair of transistors forming an output node that is the inversion of the input signal and represents the first internal control signal; and
   the second inversion circuit comprises a second pair of transistors in which a gate of each of the second pair of transistors is connected to the output node of the first inversion circuit, a source of a first one of the second pair of transistors is coupled to the low power supply voltage, a drain of the first one of the second pair of transistors is coupled to a drain of a second one of the second pair of transistors forming the second internal control signal, and wherein a source of the second one of the second pair of transistors is coupled to a low voltage potential.

4. The level shifter of claim 1 wherein the input stage comprises an inverter.

5. The level shifter of claim 1 wherein the low state voltage translation circuit comprises:
   a plurality of low state PMOS transistors coupled to a low power supply voltage and arranged as a current mirror with two current paths such that a current flowing through each of the two current paths is substantially equivalent to each other, wherein current flows through the current mirror when the first internal control signal is high; and
   a second bipolar device having its collector terminal coupled to a drain terminal of one of the plurality of low state PMOS transistors of the current mirror, its emitter terminal coupled to a low voltage potential, and its base terminal providing the bias signal, such that when current is flowing through the current mirror the bias signal is high to permit current to flow into the first bipolar device when the second bipolar device is on.

6. The level shifter of claim 5 wherein current flowing though the second bipolar device mirrors current flowing through the first bipolar device when the input signal is in its low voltage state.

7. The level shifter of claim 5 wherein the input stage comprises:
   a first inversion circuit coupled to the input terminal and that receives the input signal and generates the first internal control signal that represents the inversion of the input signal; and
   a second inversion circuit coupled to the first inversion circuit and that receives the first internal control signal and generates a second internal control signal that represents an inversion of the first internal control signal;
   wherein:
      the low state voltage translation circuit further comprises an NMOS transistor having its source terminal coupled to the low voltage potential, its gate terminal coupled to the second internal control signal, and its drain terminal coupled to the base terminal of the second bipolar device and a base terminal of the first bipolar device to remove excess charge from the base terminals of the first and second bipolar devices when the input signal is high.

8. The level shifter of claim 1 wherein the low state voltage translation circuit comprises:
an NMOS transistor having its gate coupled to the first internal control signal so that the NMOS transistor is turned on when the input signal is in its low voltage state, its source terminal coupled to a low voltage potential, and its drain terminal coupled to the plurality of high state PMOS transistors such that current is flowing to the plurality of high state PMOS transistors when the NMOS transistor is turned on; and
a resistive network adapted to reduce current flowing to the first bipolar device.

9. The level shifter of claim 1 wherein:
the input stage comprises:
a first inversion circuit coupled to the input terminal and that receives the input signal and generates the first internal control signal that represents the inversion of the input signal; and
a second inversion circuit coupled to the first inversion circuit and that receives the first internal control signal and generates a second internal control signal that represents an inversion of the first internal control signal;
the high state voltage translation circuit further comprises:
a plurality of voltage reducing NMOS transistors arranged to receive the first internal control signal and generate a reduced voltage signal when the first internal control signal is high; and
first and second NMOS transistors controlling a flow of current through the voltage reducing circuit, the first and second NMOS transistors having their drain terminals coupled to a drain of one of the plurality of high state PMOS transistors and their source terminals coupled to a low voltage potential, the first NMOS transistor having its gate coupled to the second internal control signal such that the first NMOS transistor turns on when the input signal is in its high voltage state, the second NMOS transistor having its gate coupled to the reduced voltage signal generated by the plurality of voltage reducing NMOS transistors such that the second NMOS transistor turns on when the input signal is in its low voltage state;
whereby current flowing through the voltage reducing circuit is higher when the first NMOS transistor is on enabling the high state control signal on the high state output node and is lower when the second NMOS transistor is on disabling the high state control signal on the high state output node.

10. The level shifter of claim 9 wherein the voltage reducing circuit of the high state voltage translation circuit prevents voltages at the drain terminals of the first and second NMOS transistors of the high state voltage translation circuit from rising above hot electron voltage levels.

11. The level shifter of claim 1 wherein voltages of the low voltage states of the input and output signals are equivalent to a low voltage potential.

12. The level shifter of claim 1 wherein a voltage drop across each of the plurality of high state PMOS transistors is approximately equal to each other and whereby each of the plurality of high state PMOS transistors reduces a voltage of the high power supply voltage.

13. The level shifter of claim 1 wherein current flowing through the voltage reducing circuit is higher when the input signal is in its high voltage state and is lower when the input signal is in its low voltage state.

14. The level shifter of claim 1 wherein the first bipolar device has an emitter terminal coupled to a low voltage potential, a collector terminal coupled to the output terminal, and a base terminal coupled to and biased by the bias signal of the low state voltage translation circuit.

15. The level shifter of claim 1 wherein:
the PMOS pull-up transistor couples the high power supply voltage to the output terminal when the input signal is in its high voltage state; and
the first bipolar device pulls the output signal to its low voltage state when the input signal is in its low voltage state.

16. The level shifter of claim 1 wherein:
the PMOS pull-up transistor couples the high power supply voltage to the output terminal when the input signal is in its low voltage state; and
the first bipolar device pulls the output signal to its low voltage state when the input signal is in its high voltage state.

17. The level shifter of claim 1 wherein the input stage is powered by a low power supply voltage that generates a voltage approximately equivalent to a voltage of the high voltage state of the input signal such that a voltage of the first internal control signal is approximately equivalent to a voltage of the high voltage state of the input signal.

18. A level shifter comprising:
an input terminal for receiving an input signal having low and high voltage states;
an output terminal for providing an output signal having low and high voltage states, wherein a voltage of the high voltage state of the output signal is higher than a voltage of the high voltage state of the input signal;
an input stage coupled to the input terminal and comprising:
a first inversion circuit that receives the input signal and generates a first internal control signal that represents an inversion of the input signal; and
a second inversion circuit coupled to the first inversion circuit that receives the first internal control signal and generates a second internal control signal that represents an inversion of the first internal control signal;
wherein both the first and second inversion circuits are powered by a low power supply voltage that generates a voltage approximately equivalent to the voltage of the high voltage state of the input signal such that voltages of the first and second internal control signals are approximately equivalent to the voltage of the high voltage state of the input signal;
a low state voltage translation circuit generating a bias signal when the input signal is in its low voltage state, the low state voltage translation circuit coupled to the input stage and receiving the first internal control signal and comprising:
a plurality of low state PMOS transistors coupled to the low power supply voltage and arranged as a current mirror with two current paths such that current flowing through each of the two current paths is substantially equivalent to each other, wherein current flows through the current mirror when the first internal control signal is high; and
a first bipolar device having its collector terminal and its base terminal coupled to a drain terminal of one of the plurality of low state PMOS transistors of the current mirror, its emitter terminal coupled to a low voltage potential, and its base terminal providing the bias signal, such that when current is flowing through the current mirror the bias signal is high;

a high state voltage translation circuit adapted to couple a high power supply voltage to the low voltage potential and to generate a bias voltage at a high state output node, wherein the high power supply voltage is approximately equivalent to the voltage of the high voltage state of the output signal, the high state voltage translation circuit comprising:

a plurality of high state PMOS transistors coupled to the high power supply voltage and arranged as a voltage reducing circuit with a voltage drop across each of the plurality of high state PMOS transistor approximately equal to each other and whereby each of the plurality of high state PMOS transistors reduces a voltage of the high power supply voltage;

a plurality of voltage reducing NMOS transistors arranged to receive the first internal control signal and generate a reduced voltage signal when the first internal control signal is high; and first and second NMOS transistors controlling a flow of current through the voltage reducing circuit, the first and second NMOS transistors having their drain terminals coupled to a drain of one of the plurality of high state PMOS transistors and their source terminals coupled to the low voltage potential, the first NMOS transistor having its gate coupled to the second internal control signal such that the first NMOS transistor turns on when the input signal is high, the second NMOS transistor having its gate coupled to the reduced voltage signal generated by the plurality of voltage reducing NMOS transistors such that the second NMOS transistor turns on when the input signal is low; and an output stage providing the output signal comprising:

a PMOS pull-up transistor connected to the high power supply voltage and controlled by the bias voltage generated by the high state voltage translation circuit to couple the high power supply voltage to the output terminal when the input signal is high to pull the output signal to its high voltage state, wherein a current flowing through the PMOS pull-up transistor approximately mirrors a current flowing through the voltage reducing circuit of the high state voltage translation circuit; and a second bipolar device adapted to pull the output signal to its low voltage state when the input signal is in its low voltage state, the second bipolar device having a emitter terminal coupled to the low voltage potential, a collector terminal coupled to the output terminal, and a base terminal coupled to the first bipolar device and biased by the bias signal of the low state voltage translation circuit;

whereby current flowing through the voltage reducing circuit of the high state voltage translation circuit is higher when the first NMOS transistor is on enabling a higher current at the PMOS pull-up transistor and lower when the second NMOS transistor is on disabling the PMOS pull-up transistor.

19. The level shifter of claim 18 wherein the voltage reducing circuit of the high state translation circuit prevents voltages at the drain terminals of the first and second NMOS transistors of the high state voltage translation circuit from rising above hot electron voltage levels.

20. The level shifter of claim 18 wherein the plurality of high state PMOS transistors arranged as a voltage reducing circuit of the high state voltage translation circuit are self-connected by connecting a gate of each of the plurality of high state PMOS transistors to its own drain terminal.

21. The level shifter of claim 18 wherein:

the first inversion circuit comprises a first pair of transistors in which a gate of each of the first pair of transistors is connected to the input terminal, a source of a first one of the first pair of transistors is coupled to the low power supply voltage, and a drain of the first one of the first pair of transistors is coupled to a drain of a second one of the first pair of transistors forming an output node that is the inversion of the input signal and represents the first internal control signal; and the second inversion circuit comprises a second pair of transistors in which a gate of each of the second pair of transistors is connected to the output node of the first inversion circuit, a source of a first one of the second pair of transistors is coupled to the low power supply voltage, a drain of the first one of the second pair of transistors is coupled to a drain of a second one of the second pair of transistors forming the second internal control signal, and wherein a source of the second one of the second pair of transistors is coupled to the low voltage potential.

22. The level shifter of claim 18 wherein the low state voltage translation circuit further comprises an NMOS transistor having its source terminal coupled to the low voltage potential, its gate terminal coupled to the second internal control signal, and its source terminal coupled to the base terminal of the first bipolar device and the base terminal of the second bipolar device of the output stage to remove excess charge from the base terminal of the first bipolar device when the input signal is high.

23. The level shifter of claim 18 wherein current flows to the second bipolar device when the first bipolar device is on.

24. A level shifter comprising:

an input terminal for receiving an input signal having low and high voltage states;

an output terminal for providing an output signal having low and high voltage states, wherein a voltage of the high voltage state of the output signal is different than a voltage of the high voltage state of the input signal;

an inverter that receives the input signal and generates an internal control signal that represents an inversion of the input signal, wherein the inverter is powered by a low power supply voltage that generates a voltage approximately equivalent to a voltage of the high voltage state of the input signal such that a voltage of the internal control signal is approximately equivalent to the voltage of the high voltage state of the input signal;

a low state voltage translation circuit generating a bias signal at a low state output node when the input signal is in its low voltage state, the low state voltage translation circuit receiving the internal control signal and comprising:

a first NMOS transistor having its gate coupled to the internal control signal so that the first NMOS transistor is turned on when the input signal is in its low voltage state, its source terminal coupled to a low voltage potential, and its drain terminal coupled to the low state output node such that the bias signal is active when the first NMOS transistor is turned off; and a resistive network adapted to reduce current flowing to the low state output node;

a high state voltage translation circuit coupled to a high power supply voltage and adapted to generate a high state control signal at a high state output node, wherein the high power supply voltage is approximately equivalent to the voltage of the high voltage state of the output signal, the high state voltage translation circuit comprising:

a plurality of high state PMOS transistors connected in series and coupled to the high power supply voltage, the plurality of high state PMOS transistors arranged as a voltage reducing circuit with a voltage drop across each of the plurality of high state PMOS transistors approximately equal to each other and whereby each of the plurality of high state PMOS transistors reduces a voltage of the high power supply voltage; and an output stage providing the output signal comprising:

a PMOS pull-up transistor connected the high power supply voltage and having its gate terminal coupled to the high state control signal to couple the high power supply voltage to the output terminal when the input signal is in its low voltage state to pull the output signal to its high voltage state, wherein a current flowing through the PMOS pull-up transistor approximately mirrors a current flowing through at least one of the plurality of high state PMOS transistors of the voltage reducing circuit of the high state voltage translation circuit; and a bipolar device adapted to pull the output signal to its low voltage state when the input signal is in its high voltage state, the bipolar device having an emitter terminal coupled to the low voltage potential, a collector terminal coupled to the output terminal, and a base terminal coupled to and biased by the bias signal of the low state voltage translation circuit.

25. The level shifter of claim 24 wherein the resistive network comprises a pair of NMOS transistors having their gate terminals coupled to the voltage reducing circuit.

\* \* \* \* \*